United States Patent
Park et al.

(10) Patent No.: US 9,516,233 B2
(45) Date of Patent: Dec. 6, 2016

(54) MICRO ELECTRO MECHANICAL SYSTEMS DEVICE AND APPARATUS FOR COMPENSATING TREMBLE

(71) Applicants: LG INNOTEK CO., LTD., Seoul (KR); GWANGJU INSTITUTE OF SCIENCE AND TECHNOLOGY, Gwangju (KR)

(72) Inventors: Hyun Kyu Park, Seoul (KR); Seung Hwan Moon, Seoul (KR); Jong Hyun Lee, Seoul (KR)

(73) Assignees: LG INNOTEK CO., LTD., Seoul (KR); GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/367,107

(22) PCT Filed: Nov. 7, 2012

(86) PCT No.: PCT/KR2012/009318
§ 371 (c)(1),
(2) Date: Jun. 19, 2014

(87) PCT Pub. No.: WO2013/094875
PCT Pub. Date: Jun. 27, 2013

(65) Prior Publication Data
US 2014/0313355 A1  Oct. 23, 2014

(30) Foreign Application Priority Data
Dec. 19, 2011 (KR) .................. 10-2011-0137767

(51) Int. Cl.
*H04N 5/232* (2006.01)
*H02N 1/00* (2006.01)
(Continued)

(52) U.S. Cl.
CPC ......... *H04N 5/23287* (2013.01); *B81B 3/0051* (2013.01); *G02B 26/0875* (2013.01); *G02B 27/646* (2013.01); *G03B 5/00* (2013.01); *H02N 1/002* (2013.01); *G03B 2205/0084* (2013.01)

(58) Field of Classification Search
CPC ........ G02B 27/646; G03B 5/00; G03B 5/02; G03B 2205/0053–2205/0084; H04N 5/2328–5/23287; H01L 27/20; H01L 41/00–41/47; H01L 2324/1461; H02N 1/002–1/008; H02N 2/00–2/22; B81B 2201/033; B81B 7/00–7/04; B81B 3/00–3/0097
See application file for complete search history.

(56) References Cited

U.S. PATENT DOCUMENTS 6,801,682 B2  10/2004 Zhang et al.
7,170,665 B2  1/2007 Kaneko et al.
(Continued)

FOREIGN PATENT DOCUMENTS

CN  1973428 A  5/2007
JP  2008-242207 A  10/2008
(Continued)

OTHER PUBLICATIONS

International Search Report in International Application No. PCT/KR2012/009318, filed Nov. 7, 2012.
(Continued)

*Primary Examiner* — Paul Berardesca
(74) *Attorney, Agent, or Firm* — Saliwanchik, Lloyd & Eisenschenk

(57) ABSTRACT

Disclosed are a micro electro mechanical systems (MEMS) device and an apparatus for compensating for a tremble. The MEMS device includes a substrate; a driven member moving relative to the substrate; an elastic member connected to the driven member and the substrate; a driving member fixed to the substrate for driving the driven member; and a dynamic stopper fixed to the substrate and latched to the driven member.

14 Claims, 3 Drawing Sheets

(51) Int. Cl.
  *B81B 3/00* (2006.01)
  *G02B 27/64* (2006.01)
  *G02B 26/08* (2006.01)
  *G03B 5/00* (2006.01)

(56) References Cited

U.S. PATENT DOCUMENTS

| | | |
|---|---|---|
| 2005/0016605 A1 | 1/2005 | Sherman et al. |
| 2005/0237597 A1 | 10/2005 | Epitaux et al. |
| 2009/0179992 A1* | 7/2009 | Jeong .................. H04N 5/2253 348/207.99 |
| 2012/0081598 A1* | 4/2012 | Calvet .................. B81B 3/0037 348/357 |
| 2013/0077945 A1* | 3/2013 | Liu .................... G02B 26/0841 396/55 |

FOREIGN PATENT DOCUMENTS

| | | |
|---|---|---|
| KR | 10-2011-0113977 A | 10/2011 |
| KR | 102010003356 | * 10/2011 |

OTHER PUBLICATIONS

Office Action dated Jul. 2, 2015 in Chinese Application No. 201280068442.9.

* cited by examiner

MICRO ELECTRO MECHANICAL SYSTEMS DEVICE AND APPARATUS FOR COMPENSATING TREMBLE

CROSS-REFERENCE TO RELATED APPLICATIONS

This application is the U.S. national stage application of International Patent Application No. PCT/KR2012/009318, filed Nov. 7, 2012, which claims priority to Korean Application No. 10-2011-0137767, filed Dec. 19, 2011, the disclosures of each of which are incorporated herein by reference in their entirety.

TECHNICAL FIELD he embodiment relates to a micro electro mechanical systems (MEMS) device and an apparatus for compensating for a tremble.

BACKGROUND ART

A CCD (Charge Coupled Device) sensor and a CMOS (Complementary Metal Oxide Semiconductor) sensor are kinds of 2-D (dimensional) sensors to photograph dynamic images and still images and serve as essential elements of an electronic camera. Specifically, although the CCD sensor represents the picture quality better than that of the CMOS sensor, the market share of the CMOS image sensor has been increased due to defects of the CCD sensor, such as power consumption and a complex structure. Recently, the picture quality of the CMOS sensor has been improved. With the development of the image sensors, a digital camera has been extensively used and a camera device has been installed in a portable terminal such as a cellular phone.

In a camera that photographs still images and dynamic images using the image sensor, unstable trembling pictures are frequently resulted due to the trembling caused by external factors, such as hand-trembling or vibration of a vehicle. In order to solve the problem of the unstable images, an apparatus for compensating for a motion has been proposed. Such a motion compensating apparatus is divided into a motion detecting member and a motion correcting member. The motion detecting member utilizes a method of predicting a motion of an apparatus using a gyro sensor and a method of detecting a moving portion of images every frame through an image signal processing. Further, incident light is arbitrarily refracted by using a refractive lens (active prism) or an input position of an image sensor is controlled based on detected motion information, thereby solving the problem of the unstable images and obtaining fine images.

A technology for driving a lens using a voice coil motor in order to solve the problem of an unstable image caused by the movement of the camera is disclosed in U.S. Pat. No. 5,398,132 (issued on Mar. 14, 1995). An apparatus for stabilizing images disclosed in the above patent includes a pitch coil and a pitch yoke, which are installed at one side of a correction lens to drive the correction lens in the first direction, and a yaw coil and a yaw yoke, which are installed at the other side to drive the correction lens in the second direction perpendicular to the first direction. That is, an image is stabilized by driving the correction lens according to the camera motion in such a manner that an optical axis can return to its original position.

However, in recent years, although a camera device is installed in portable terminals, such as lap-top computers or mobile phones, to expand the function of the portable terminals, an apparatus for compensating for trembling images caused by users hand-trembling may become an obstacle in terms of the small-size and lightweight of the portable terminal.

DISCLOSURE OF INVENTION

Technical Problem

The embodiment provides a MEMS device and an apparatus for compensating for a tremble, capable of effectively compensating for a shake and a tremble while improving the reliability and durability.

Solution to Problem

According to the embodiment, a MEMS device includes a substrate; a driven member moving relative to the substrate; an elastic member connected to the driven member and the substrate; a driving member fixed to the substrate for driving the driven member; and a dynamic stopper fixed to the substrate and latched to the driven member.

According to the embodiment, an apparatus for compensating for a tremble includes a fixed substrate; a driven member moving relative to the fixed substrate; an optical device included in the driven member; an optical device included in the driven member; a driving member fixed to the fixed substrate for driving the driven member; and a dynamic stopper fixed to the fixed substrate and latched to the driven member.

Advantageous Effects of Invention

The MEMS device according to the embodiment includes the dynamic stopper latched to the driven member. Specifically, the dynamic stopper may be operated according to whether the driven member is driven by the driving member.

Specifically, when the driven member is driven, the dynamic stopper is unlatched from the driven member, so that the driven member may move relative to the substrate. Further, when the driven member is not driven, the driven member may not move relative to the fixed substrate. At this time, the dynamic stopper may be latched to the driven member and firmly fixed to the fixed substrate by the dynamic stopper.

Since the driving member properly moves the driven member, a tremble of a camera including the MEMS device according to the embodiment may be corrected. That is, the MEMS device according to the embodiment may compensate for a hand tremble.

Further, when there is no need to drive the driven member, for example, when a camera including the MEMS device according to the embodiment is not shaken, the driven member must be fixed to a predetermined position. The MEMS device and the apparatus for compensating for a tremble according to the embodiment may fix the driven member using the dynamic stopper as well as the elastic member.

Therefore, the MEMS device and the apparatus for compensating for a tremble according to the embodiment may prevent the elastic member from being deformed and can improve the reliability and durability. Further, since the elastic member may be reinforced by the dynamic stopper, the elastic member does not need to have strong elasticity. Therefore, the driven member may be driven by a low voltage.

BEST MODE FOR CARRYING OUT THE INVENTION

Figure 1:
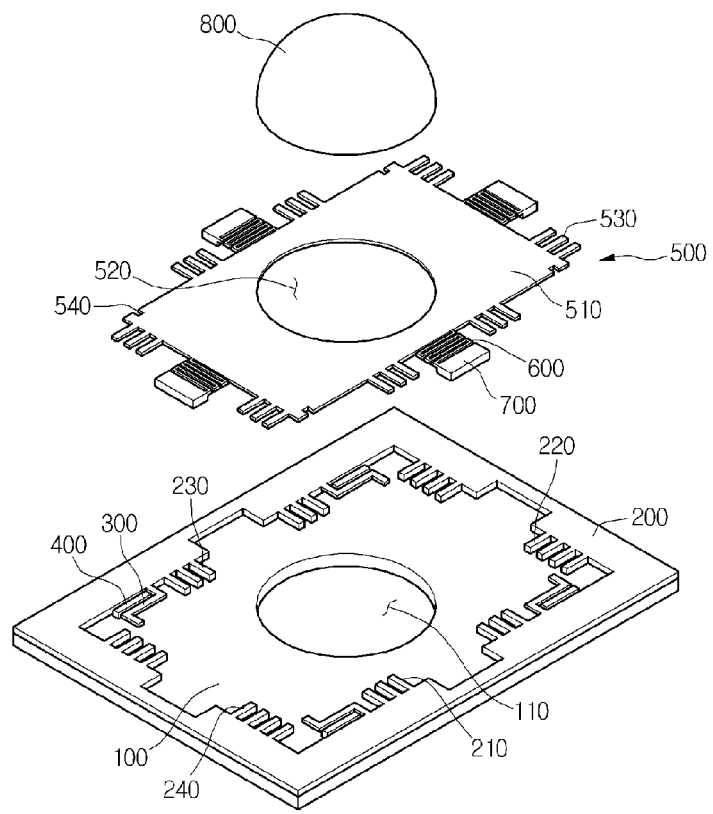
FIG. 1 is an exploded perspective view illustrating an apparatus for compensating for a hand tremble according to an embodiment.

In the description of the embodiments, it will be understood that when a panel, a sheet, a member, a guide or a unit is referred to as being "on" or "under" another panel, another sheet, another member, another guide or another unit, it can be "directly" or "indirectly" over the other panel, sheet, member, guide or unit, or one or more intervening layers may also be present. Such a position of the elements has been described with reference to the drawings. The thickness and size of each element shown in the drawings may be exaggerated for the purpose of convenience or clarity. In addition, the size of elements does not utterly reflect an actual size.

Figure 2:
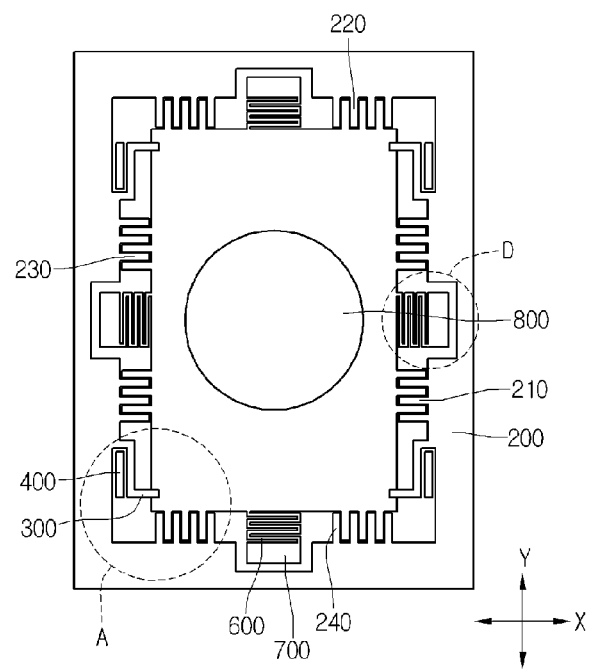
FIG. 2 is a plan view illustrating an apparatus for compensating for a hand tremble according to an embodiment.
Figure 3:
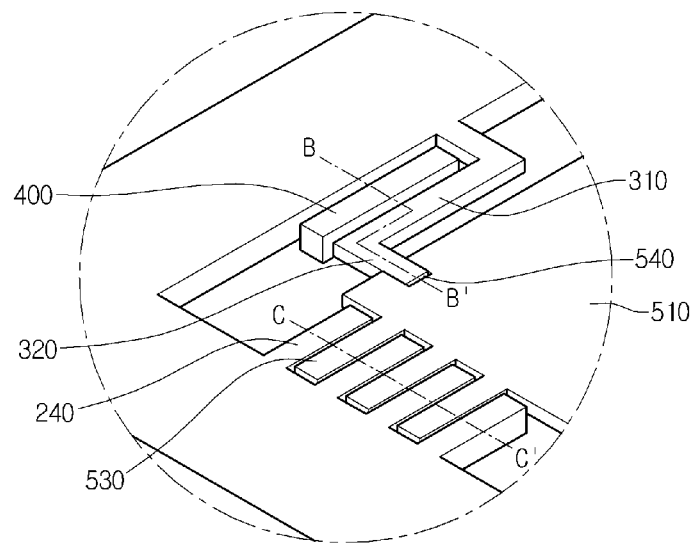
FIG. 3 is an enlarged perspective view of a part A shown in FIG. 2.
Figure 4:
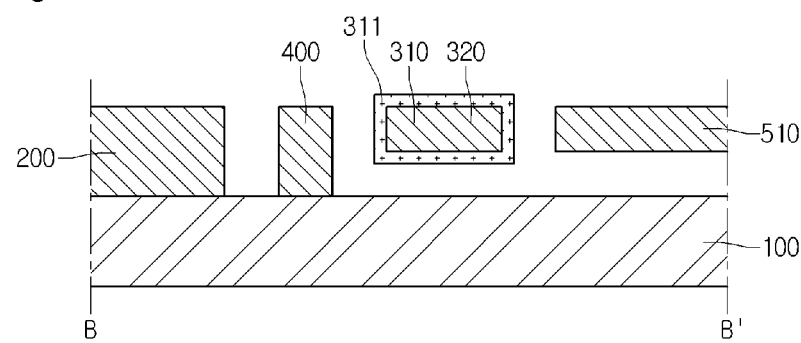
FIG. 4 is a sectional view taken along line B-B' of FIG. 3.
Figure 5:
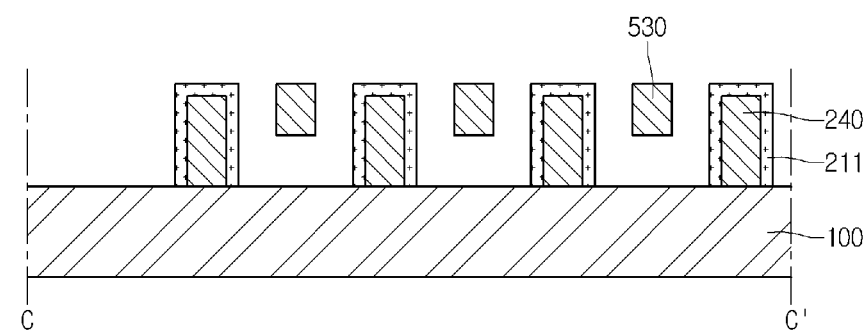
FIG. 5 is a sectional view taken along line C-C' of FIG. 3.
Figure 6:
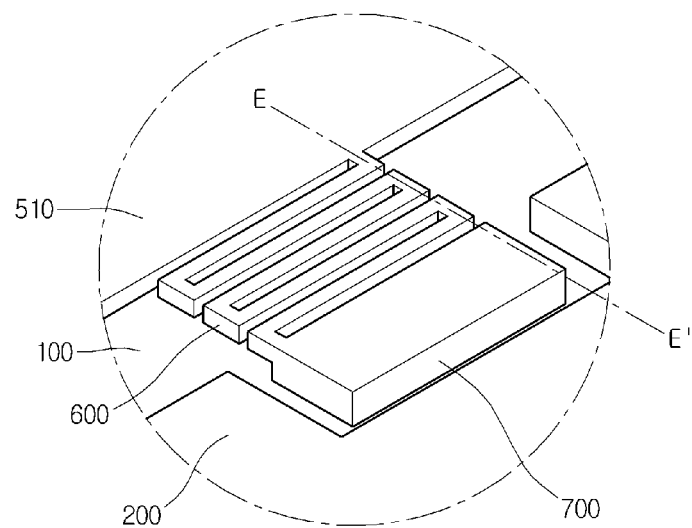
FIG. 6 is an enlarged perspective view of a part D shown in FIG. 2.
Figure 7:
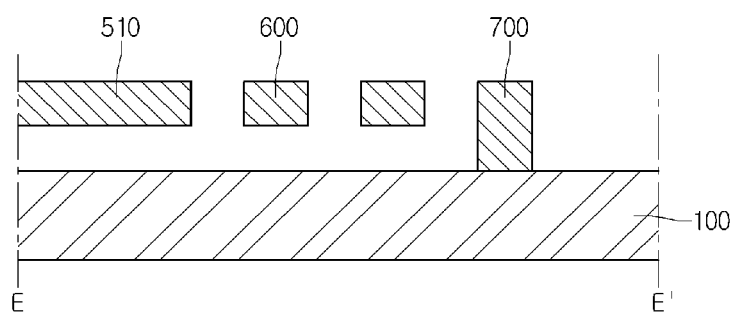
FIG. 7 is a sectional view taken along line E-E of FIG. 6.

FIG. 1 is an exploded perspective view illustrating an apparatus for compensating for a tremble according to an embodiment. FIG. 2 is a plan view illustrating an apparatus for compensating for a tremble according to an embodiment. FIG. 3 is an enlarged perspective view illustrating a part A of FIG. 2. FIG. 4 is a sectional view taken along line B-B' of FIG. 3. FIG. 5 is a sectional view taken along line C-C' of FIG. 3. FIG. 6 is an enlarged perspective view illustrating a part D of FIG. 2. FIG. 7 is a sectional view taken along line E-E of FIG. 6.

Referring to FIGS. 1 to 7, an apparatus for compensating for a hand tremble includes a fixed substrate 100, a driving member 200, a dynamic stopper 300, a stopper driving member 400, a driven member 500, an elastic member 600, a fixing member 700, and an optical device 800.

The fixed substrate 100 supports the driving member 200, the dynamic stopper 300, the stopper driving member 400, the driven member 500, the elastic member 600, and the fixing member 700. Further, the driving member 200, the stopper driving member 400, and the fixing member 700 are fixed to the fixed substrate 100.

The fixed substrate 100 has a plate shape. A hollow 110 may be formed in the fixed substrate 100. Light may transmit through the hollow 110.

The fixed substrate 100 may be an insulator. The fixed substrate 100 may be a silicon substrate, a glass substrate, or a polymer substrate.

The driving member 200 is disposed on the fixed substrate 100. The driving member 200 may be fixed to the fixed substrate 100. In detail, the driving member 200 may be fixed on an upper surface of the fixed substrate 100. The driving member 200 may surround the periphery of the driven member 500.

The driving member 200 drives the driven member 500. The driving member 200 may drive the driven member 500 in two axis directions. For example, the driving member 200 may drive the driven member 500 in X and Y axis directions which are perpendicular to each other.

The driving member 200 includes the first driving electrode 210, the second driving electrode 220, the third driving electrode 230, and the fourth driving electrode 240.

The first driving electrode 210, the second driving electrode 220, the third driving electrode 230, and the fourth driving electrode 240 may be formed of a metal material. The first driving electrode 210, the second driving electrode 220, the third driving electrode 230, and the fourth driving electrode 240 may be coated with an insulation layer 211.

Thus, the insulation layer 211 may prevent the first driving electrode 210, the second driving electrode 220, the third driving electrode 230, and the fourth driving electrode 240 from being shorted by an external electrode.

The first driving electrode 210 is disposed at one side of the driven member 500. The first driving electrode 210 extends toward the driven member 500. The first driving electrode 210 is fixed to the fixed substrate 100.

The first driving electrode 210 may have a comb shape. That is, the first driving electrode 210 may include branch electrodes which extend in parallel with each other. The first driving electrode 210 may extend in the X axis direction.

The second driving electrode 220 is disposed at the other side of the driven member 500. The second driving electrode 220 extends toward the driven member 500. The second driving electrode 220 is fixed to the fixed substrate 100.

The second driving electrode 220 may have a comb shape. That is, the second driving electrode 220 may include branch electrodes which extend in parallel with each other. The second driving electrode 220 may extend in the Y axis direction.

The third driving electrode 230 is disposed at the other side of the driven member 500. The third driving electrode 230 extends toward the driven member 500. The third driving electrode 230 is fixed to the fixed substrate 100.

The third driving electrode 230 may have a comb shape. That is, the third driving electrode 230 may include branch electrodes which extend in parallel with each other. The third driving electrode 230 may extend in the X axis direction.

The driven member 500 is disposed between the first and third driving electrodes 210 and 230. The first and third driving electrodes 210 and 230 may drive the driven member 500 in the X axis direction.

The fourth driving electrode 240 is disposed at the other side of the driven member 500. The fourth driving electrode 240 extends toward the driven member 500. The fourth driving electrode 240 is fixed to the fixed substrate 100.

The fourth driving electrode 240 may have a comb shape. That is, the fourth driving electrode 240 may include branch electrodes which extend in parallel with each other. The fourth driving electrode 240 may extend in the Y axis direction.

The driven member 500 is disposed between the second and fourth driving electrodes 220 and 240. The second and fourth driving electrodes 220 and 240 may drive the driven member 500 in the Y axis direction.

Thus, the driving member 200 may drive the driven member 500 in two axis directions. Further, driving signals may be independently applied to the first driving electrode 210, the second driving electrode 220, the third driving electrode 230 and the fourth electrode 240, respectively.

Specifically, the first driving electrode 210, the second driving electrode 220, the third driving electrode 230 and the fourth electrode 240 may drive the driven member 500 with electrostatic attractive force.

As depicted in FIGS. 3 and 4, the dynamic stopper 300 is fixed to the driving member 200. The dynamic stopper 300 is spaced apart from the upper surface of the fixed substrate 100. Thus, in a state that one end of the dynamic stopper 300 is fixed to the fixing member 700, the opposite end of the dynamic stopper 300 may move with respect to the fixed substrate 100. The dynamic stopper 300 is fixed through the fixing member 700 to the fixed substrate 100.

Further, the dynamic stopper 300 is latched to the driven member 500. In more detail, the dynamic stopper 300 may be inserted into a latch groove 540 formed at the driven member 500, such that the dynamic stopper 300 may be latched to the driven member 500. That is, a portion of the dynamic stopper 300 may be inserted into the latch groove 540, such that the dynamic stopper 300 may be latched to the driven member 500.

The dynamic stopper 300 may be unlatched from the latch groove 540. That is, the dynamic stopper 300 may selectively fix or release the driven member 500.

The dynamic stopper 300 includes an extension member 310 and a latch member 320.

The extension member 310 extends from the driving member 200. Further, the extension member 310 may extend along a space between the driving member 200 and the driven member 500.

The latch member 320 extends from the extension member 310 while being bent or curved. A member or the entire portion of the latch member 320 may be inserted into the latch groove 540.

The dynamic stopper 300 may be formed of a metal. The dynamic stopper 300 may further include an insulation layer 311 surrounding the metal.

Although the four dynamic stoppers 300 are applied and depicted in the embodiment, the embodiment is not limited thereto. That is, one dynamic stopper 300 may be applied on a side surface of the driven member 500. In addition, at least five dynamic stoppers 300 may be applied.

The stopper driving member 400 is adjacent to the dynamic stopper 300. The stopper driving member 400 may be fixed to the fixed substrate 100. The stopper driving member 400 may extend along the extension member 310 together with the extension member 310.

The stopper driving member 400 is interposed between the dynamic stopper 300 and the driving member 200. The stopper driving member 400 may be spaced amember from the dynamic stopper 300 by a predetermined distance. The stopper driving member 400 may drive the dynamic stopper 300 by electrostatic attractive or repulsive force.

For example, the dynamic stopper 300 may be unlatched from the latch groove 540 by the stopper driving member 400 and attractive force applied thereto. Further, when the attractive force applied to the stopper driving member 400 disappears, the latch member 320 may be inserted into the latch groove 540 due to the electricity thereof.

Thus, the stopper driving member 400 may allow the dynamic stopper 300 to be inserted into or unlatched from the driven member 500.

The driven member 500 is disposed on the fixed substrate 100. Further, the driven member 500 is disposed in the driving member 200. The driven member 500 may be a movable substrate.

The driven member 500 is spaced amember from the fixed substrate 100. The driven member 500 may be spaced amember from the fixed substrate 100 by a predetermined distance. That is, the driven member 500 may float over the fixed substrate 100.

The driven member 500 is fixed to the fixed substrate 100 by the elastic member 600 and the fixing member 700. That is, the driven member 500 is provided in the fixed substrate 100 such that the driven member 500 can move relative to the fixed substrate 100.

The driven member 500 includes a body 510 and a plurality of branch electrodes 530. A hollow 520 may be formed in the body 510 to allow light to transmit through the hollow 520. The body 510 may have a plate shape. The latch groove 540 is formed in the body 510. The latch groove 540 is formed on a side surface of the body 510.

The branch electrodes 530 extend outward from the body 510. In more detail, the branch electrodes 530 extend from the body 510 to the driving member 200. The branch electrodes 530 extend from a side surface of the body 510.

The branch electrodes 530 are inserted into the first driving electrode 210, the second driving electrode 220, the third driving electrode 230, and the fourth driving electrode 240. That is, the branch electrodes 530 and the branch electrodes of the first to fourth driving electrodes 240 may be alternately disposed with each other.

As depicted in FIGS. 6 and 7, the elastic member 600 is connected to the driven member 500. The elastic member 600 is connected to the body 510. The elastic member 600 is connected to the fixing member 700. The elastic member 600 may be spaced amember from the fixed substrate 100. The elastic member 600 may be fixed through the fixing member 700 to the fixed substrate 100.

A material having high elasticity may be used for the elastic member 600. A metal such as aluminum, copper, tungsten, or silver may be used for the elastic member 600. Further, polymer may be used for the elastic member 600.

The fixing member 700 is disposed on the fixed substrate 100. The elastic member 600 is connected to the fixing member 700. That is, the driven member 500 is connected through the elastic member 600 and the fixing member 700 to the fixed substrate 100.

The polymer and the metal may be used as a member of the fixing member 700. Although four fixing members 700 are depicted in drawings, the embodiment is not limited thereto. At least five fixing members 700 and elastic members 600 may be used to allow the driven member 500 to be connected to the fixed substrate 100.

The optical device 800 is combined with the driven member 500. Thus, the optical device 800 is driven together with the driven member 500. The optical device 800 may be a correction lens or an image sensor.

The apparatus for compensating for a tremble according to the embodiment may compensate for an external tremble such as a hand tremble by driving the driven member 500.

For example, when the optical device 800 is the correction lens, the apparatus for compensating for a tremble according to the embodiment may be disposed at a lens closest to the subject in a camera module, or may be disposed between an image sensor and a lens.

At this time, when a camera is shaken, the apparatus for compensating for a tremble according to the embodiment may suitably drive the driven member 500 to compensate for the tremble of the camera. Specifically, the apparatus for compensating for a tremble according to the embodiment may sense the amount of trembling through an angular velocity sensor or a Gyro sensor to suitably control the driven member 500.

Further, an image sensor may be disposed in the driven member 500 as the optical device 800. At this time, a lens assembly and a filter may be directly disposed on the fixed substrate 100. Similarly, the apparatus for compensating for a tremble according to the embodiment may be applied to a camera, and may directly control the image sensor according to a tremble of the camera. Thus, the apparatus for compensating for a tremble according to the embodiment may compensate for a tremble of a camera.

As described above, the apparatus for compensating for a tremble according to the embodiment includes the dynamic stopper 300 latched to the driven member 500. Specifically, the dynamic stopper 300 may be operated according to whether the driven member 500 is driven by the driving member 220.

Specifically, when the driven member 500 is driven, the dynamic stopper 300 is unlatched from the driven member 500, so that the driven member 500 may move relative to the fixed substrate 100. Further, the driven member 500 may not be driven and may not move relative to the fixed substrate 100. At this time, the dynamic stopper 300 may be latched to the driven member 500 and be firmly fixed to the fixed substrate 100 by the dynamic stopper 300.

Since the driving member 200 properly moves the driven member 500, a tremble of a camera including the apparatus for compensating for a tremble according to the embodiment may be corrected. That is, the apparatus for compensating for a tremble according to the embodiment may compensate for a hand tremble.

Further, when there is no need to drive the driven member 500 for example, when a camera including the apparatus for compensating for a tremble according to the embodiment is not shaken, the driven member 500 must be fixed to a predetermined position. The apparatus for compensating for a tremble according to the embodiment may fix the driven member 500 using the dynamic stopper 300 as well as the elastic member 600.

Therefore, the apparatus for compensating for a tremble according to the embodiment may prevent the elastic member 600 from being deformed and can improve the reliability and durability. Further, since the elastic member 600 may be reinforced by the dynamic stopper 300, the elastic member 600 does not need to have strong elasticity. Therefore, the driven member 500 may be driven by a low voltage.

Further, the dynamic stopper structure according to the embodiment may be applied not only to the apparatus for compensating for a tremble, but also to various MEMS devices. That is, when the driven member is fixed by the elastic member and driven by the driving member in various MEMS devices, the dynamic stopper may be applied for fixing the driven member.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component members and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A MEMS device comprising:
a substrate;
a driven member moving relative to the substrate;
an elastic member connected to the driven member and the substrate;
a driving member fixed to the substrate for driving the driven member;
a dynamic stopper fixed to the substrate and latched to the driven member;
an insulation layer coated on an entire surface of the dynamic stopper;
wherein the driven member comprises a latch groove,
wherein the dynamic stopper is inserted into the latch groove to fix the driven member, and
wherein the insulation layer is interposed between the dynamic stopper and an inner wall of the latch groove and inserted into the latch groove when the driven member is not being driven by the driving member; and
wherein the dynamic stopper is entirely spaced apart from the inner wall of the latch groove by the insulation layer.

2. The MEMS device of claim 1, wherein the dynamic stopper comprises:
a fixing member fixed to the substrate;
an extension member extending from the fixing member; and
a latch member extending from the extension member while being bent or curved,
wherein the latch member is inserted into the latch groove.

3. The MEMS device of claim 1, further comprising a stopper driving member facing the extension member for driving the extension member,
an image sensor included in the driven member; and
a lens member facing the image sensor.

4. The MEMS device of claim 2, wherein the driven member is disposed on the substrate, the extension member extends along a side surface of the driven member, and the latch groove is formed on the side surface of the driven member.

5. The MEMS device of claim 3, wherein the driving member comprises a driving electrode for driving the driven member, and the driving electrode is operated together with the stopper driving member.

6. An apparatus for compensating for a tremble, the apparatus comprising:
a fixed substrate;
a driven member moving relative to the fixed substrate;
an optical device included in the driven member;
a driving member fixed to the fixed substrate for driving the driven member;
a dynamic stopper fixed to the fixed substrate and latched to the driven member;
a first insulation layer coated on an entire surface of the dynamic stopper;
wherein the driven member comprises a latch groove,
wherein the dynamic stopper is inserted into the latch groove to fix the driven member, and wherein the first insulation layer is interposed between the dynamic stopper and an inner wall of the latch groove and inserted into the latch groove when the driven member is not being driven by the driving member; and wherein the dynamic stopper is entirely spaced apart from the inner wall of the latch groove by the insulation layer.

7. The apparatus of claim 6, wherein the optical device comprises an image sensor.

8. The apparatus of claim 7, wherein the optical device further comprises a lens facing the image sensor.

9. The apparatus of claim 6, wherein the driving member comprises a plurality of first driving electrodes fixed to the fixed substrate, and the driven member comprises second driving electrodes disposed between the first driving electrodes, respectively.

10. The apparatus of claim 9, further comprising a second insulation layer disposed between the first driving electrodes and the second driving electrodes.

11. The apparatus of claim 6, wherein the dynamic stopper comprises a latch member inserted into the latch groove of the driven member, and the apparatus comprises a stopper driving member for allowing the latch member to be unlatched from the driven member when the driven member is driven by the driving member.

12. The apparatus of claim 6, further comprising an elastic member for connecting the driven member to the fixed substrate.

13. The apparatus of claim 12, wherein the elastic member is connected to a fixing member disposed on the fixed substrate, and the driven member is fixed to the fixed substrate by the elastic member and the fixing member.

14. The apparatus of claim 6, wherein the driven member floats over the fixed substrate.

\* \* \* \* \*